United States Patent [19]
Hotta

[11] Patent Number: 5,268,861
[45] Date of Patent: Dec. 7, 1993

[54] SEMICONDUCTOR READ ONLY MEMORY

[75] Inventor: Yasuhiro Hotta, Nara, Japan

[73] Assignee: Sharp Kabushiki Kaisha, Osaka, Japan

[21] Appl. No.: 845,257

[22] Filed: Mar. 3, 1992

[30] Foreign Application Priority Data

Apr. 10, 1991 [JP] Japan ................................. 3-77914

[51] Int. Cl.⁵ ...................... G11C 13/00; G11C 11/40
[52] U.S. Cl. ...................................... 365/104; 365/51
[58] Field of Search ................. 365/51, 104, 94, 148, 365/206

[56] References Cited
U.S. PATENT DOCUMENTS 5,050,125  9/1991  Momodomi et al. ............... 365/185

Primary Examiner—Terrell W. Fears
Attorney, Agent, or Firm—Nixon & Vanderhye

[57] ABSTRACT

A semiconductor read only memory with hierarchical bit lines in which a resistance against a discharge current is constant irrespective of the position of a memory cell from which information is to be read is disclosed. A bank selecting MOSFET is connected to one end portion of a sub-bit line. Another bank selecting MOSFET is connected to the other end portion of the adjacent sub-bit line. Bank selecting MOSFETs are connected in the same alternate manner as described above. Therefore, since the resistance on bit lines against the read-out current is constant, a larger read-out current can be used especially when diffusion bit lines are used, whereby the semiconductor read only memory of the invention can achieve a high-speed read operation.

4 Claims, 8 Drawing Sheets

SEMICONDUCTOR READ ONLY MEMORY

BACKGROUND OF THE INVENTION

1. Field of the Invention

The present invention relates to a semiconductor read only memory, and more particularly to a semiconductor read only memory in which MOSFETs constituting memory cells are connected in parallel.

2. Description of the Prior Art

FIG. 5 shows an equivalent circuit of a semiconductor read only memory (hereinafter, sometimes referred to simply as "a ROM") which is conventionally and widely used. This ROM is a lateral ROM constructed in such a manner that memory cells 3 of MOSFETs are connected in parallel with respect to a plurality of bit lines 2 which cross word lines 1. It is known that each of the bit lines 2 is made of metal or made by diffusion (the former is referred to as a metal bit line, and the latter is referred to as a diffusion bit line).

In order to dispose memory cells more densely, a hierarchical system (hereinafter, referred to as a hierarchical bit line system) has been proposed (Japanese Patent Application No. 63-75300), as shown in FIG. 6. In the system, main bit lines $Mb_l$, $Mb_{l+1}$, ... etc. and sub-bit lines $bm_{2l}$, $bm_{2l+1}$, ..., etc. are hierarchically provided. In the hierarchical bit line system, each of the memory cells such as $Mm_{2l,2}$ is connected between two adjacent sub-bit lines, and the memory cells are alternately assigned into two groups of odd-numbered banks such as $Bm_{2l-1}$ and even-numbered banks such as $Bm_{2l}$. For the selection of these banks, bank selecting MOSFETs $QO_{m.2l}$, $QE_{m.2l}$, ..., etc. are provided on both ends of the sub-bit lines, respectively. Bank select lines $BO_m$ and $BE_m$ are connected to these bank selecting MOSFETs. The main bit lines $Mb_l$, $Mb_{l+1}$, ..., etc. are connected to sense amplifiers such as $SA_l$, or connected to GND via MOSFETs such as $Q_{l+1}$.

In the ROM with the hierarchical bit line system, the wired pitch of the main bit lines can be made double as compared with the conventional lateral ROM shown in FIG. 5. The ROM with the hierarchical bit line system can advantageously reduce the parasitic capacitance on bit lines, and especially when the diffusion bit lines are used, the wiring resistance on bit lines can be greatly reduced.

However, when the diffusion bit lines are used in the hierarchical bit line system shown in FIG. 6, there arises a problem in that the diffusion resistance greatly varies depending on the position of a memory cell in a bank, which is described below, so that the value of discharge current for the read of information greatly varies depending on the position of the memory cell. There is another problem in that since the value of the diffusion resistance is large and the value of the discharge current is small, such a ROM is not suitable for high-speed reading.

For example, the case where information is read out from a memory cell $Mm_{2l-1.1}$ by setting the bank select line $BO_m$ High, the other bank select line $BE_m$ Low, and the word line $WL_1$ High is considered. In this case, the control signal VG for the transistor $Q_l$ (not shown) connected to the main bit line $Mb_l$ is made Low. The control signal VG for the transistor $Q_{l-1}$ connected to the adjacent main bit line $Mb_{l-1}$ is made High, so that the main bit line $Mb_{l-1}$ is connected to the GND. The circuit in the above-mentioned state is shown in FIG. 7. The discharge current i flows through the main bit line $Mb_l$, the bank selecting MOSFET $QO_{m\ 2l-1}$, the sub-bit line $b_{m.2l-1}$, the memory cell $Mm_{2l-1.1}$, the sub-bit line $b_{m.2l-2}$, and the main bit line $Mb_{l-1}$, in this order. The total value of diffusion resistance of the sub-bit lines $b_{m.2l-1}$ and $b_{m.2l-2}$ in this path is 2r, if the resistance value between respective two cells is indicated by r.

Now, the case where information is read out from a memory cell $Mm_{2l-1.n}$ is considered. The circuit in this case is shown in FIG. 8. The total value of diffusion resistance of the sub-bit lines $b_{m.2l-1}$ and $b_{m.2l-2}$ in the path is 2nr. In this case, the diffusion resistance of sub-bit lines becomes largest.

As described above, in the ROM shown in FIG. 6, the value of diffusion resistance greatly varies depending on the position of a memory cell from which information is read out.

SUMMARY OF THE INVENTION

The semiconductor read only memory of this invention, which overcomes the above-discussed and numerous other disadvantages and deficiencies of the prior art, comprises: a plurality of first bit lines disposed in parallel; a plurality of groups of memory cells, in each group, memory cells being connected in parallel between two adjacent ones of said first bit lines; second bit lines disposed in parallel to said first bit lines, the proportion of said second bit lines to said first bit lines being 1 to 2; a group of first bank selecting switches each of which is connected between one end of an odd-numbered one of said first bit lines and one end of an odd-numbered one of said second bit lines; and a group of second bank selecting switches each of which is connected between one end of an even-numbered one of said first bit lines and one end of an even-numbered one of said second bit lines.

In a preferred embodiment, said groups of first and second bank selecting switches are constructed using a plurality of pairs of two adjacent selecting switches, said adjacent two selecting switches being connected to the same one of said second bit lines.

In a preferred embodiment, said memory cells and said selecting switches are MOSFETs.

In a preferred embodiment, said first bit lines are made by diffusion layers, and said second bit lines are metal lines.

Thus, the invention described herein makes possible the objective of providing a ROM capable of reading out at a high speed while provided with memory cells densely disposed.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
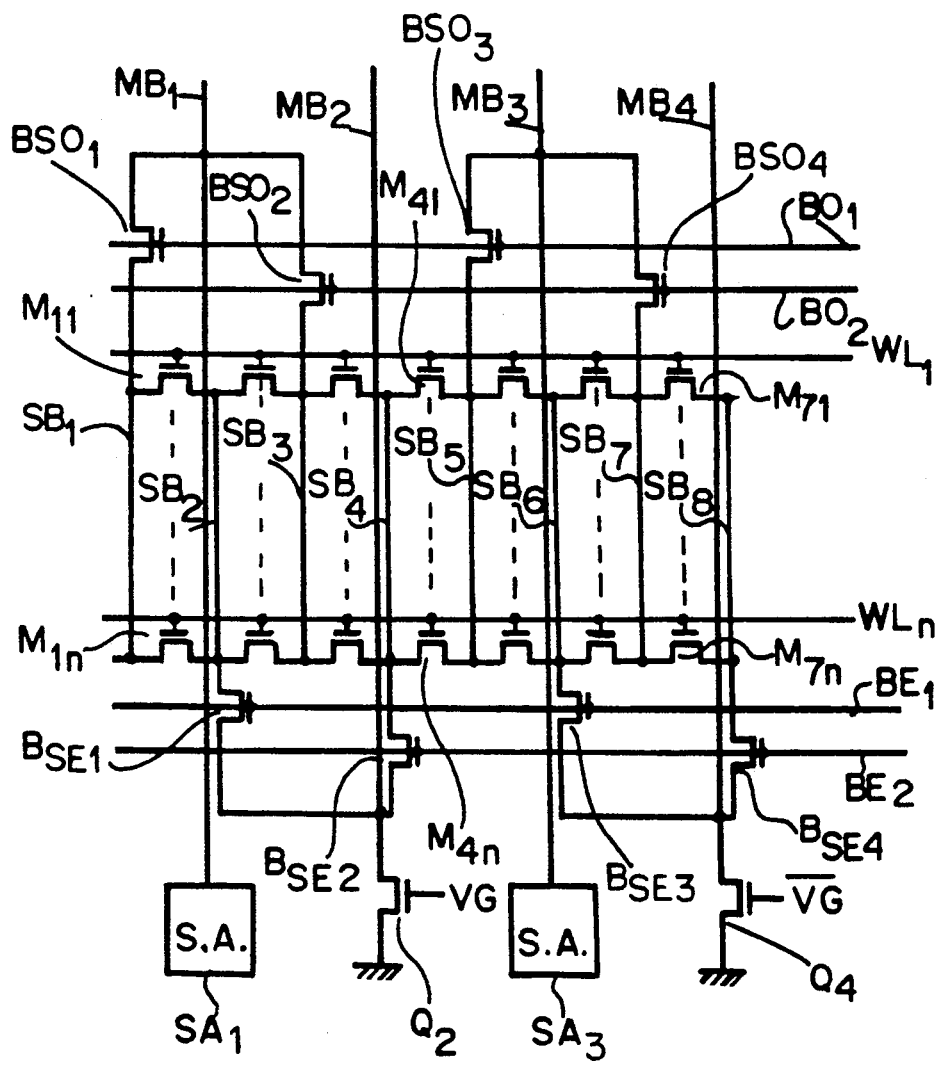
FIG. 1 is a circuit diagram showing a portion of a ROM in one embodiment of the invention.
Figure 2:
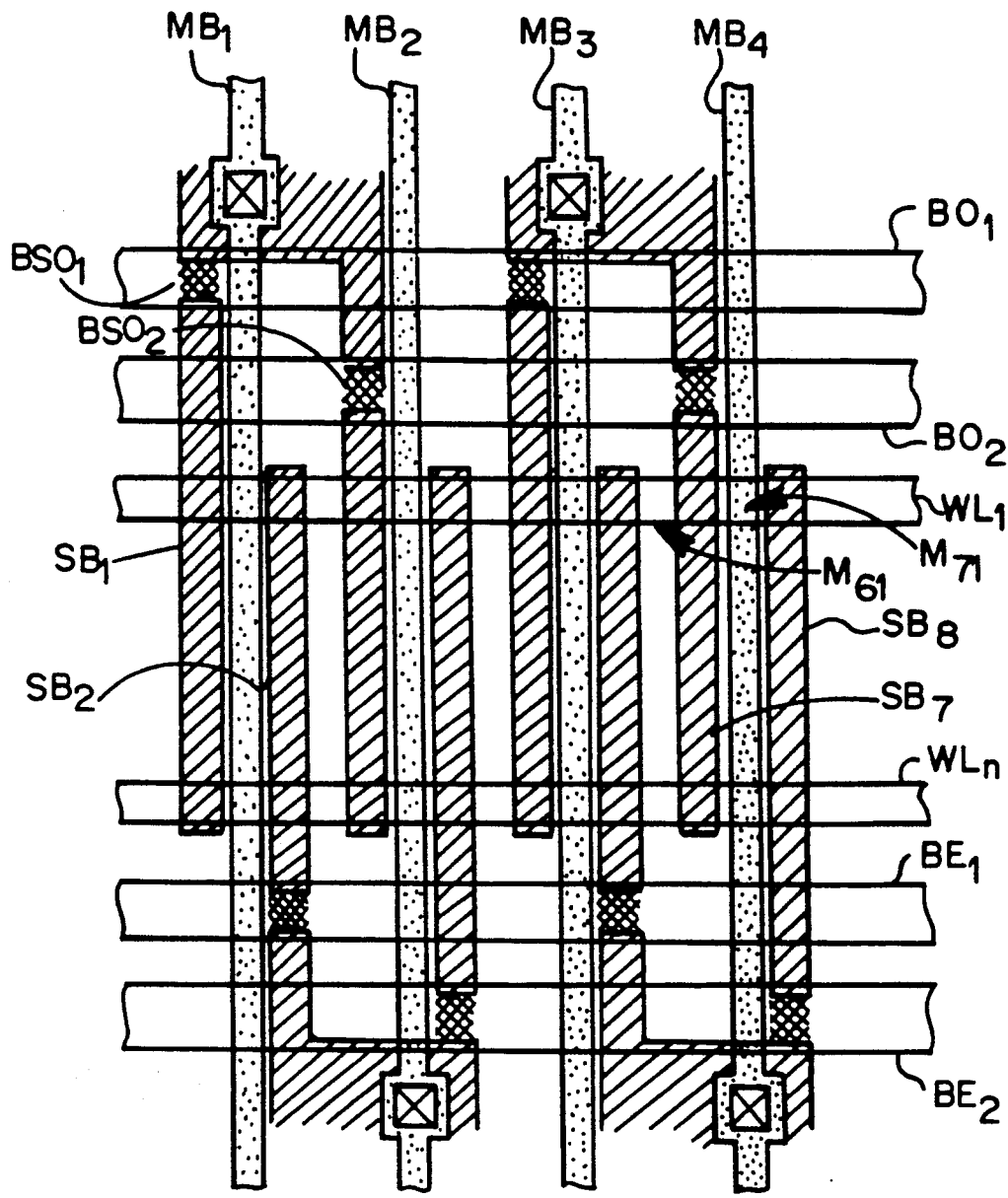
FIG. 2 shows a layout of the embodiment having diffusion bit lines.

FIG. 1 shows a portion of a ROM in one embodiment of the invention. FIG. 2 shows a pattern on the surface of a semiconductor substrate in this embodiment. The ROM of this embodiment basically adopts a hierarchical bit line system. The bit lines are constituted by sub-bit lines $SB_1$, $SB_2$, ..., etc., and main bit lines $MB_1$, $MB_2$, ..., etc. Each of the main bit lines (e.g., $MB_1$) is formed between an odd-numbered sub-bit line and the succeeding even-numbered sub-bit line (e.g., between $SB_1$ and $SB_2$). A plurality of memory cells $M_{ij}$ of MOSFETs are connected in parallel between respective two sub-bit lines. The gates of the memory cells $M_{ij}$ in each column are connected to word lines $WL_j$. The main bit lines $MB_1$, $MB_2$, ..., etc. are connected to sense amplifiers such as $SA_1$, or to GND via transistors such as $Q_2$.

To the ends of the odd-numbered sub-bit lines $SB_{2m-1}$ (m is a integer, 1 or larger) on the side of the memory cells $M_{il}$ (i.e., on the upper side in FIG. 1), bank selecting MOSFETs $BSO_1$, $BSO_2$, ..., etc. are respectively connected. Two adjacent MOSFETs (e.g., $BSO_1$ and $BSO_2$) are also connected to an odd-numbered main bit line (e.g., $MB_1$) which is provided therebetween. The gates of the bank selecting MOSFETs $BSO_1$, $BSO_2$, ..., etc. which are connected to these odd-numbered sub-bit lines are alternately connected to two bank select lines $BO_1$ and $BO_2$.

To the ends of the even-numbered sub-bit lines $SB_{2m}$ (m is a integer, 1 or larger) on the side of the memory cells $M_{in}$ (i.e., on the lower side in FIG. 1), bank selecting MOSFETs $BSE_1$, $BSE_2$, ..., etc. are respectively connected. Two adjacent MOSFETs (e.g., $BSE_1$ and $BSE_2$) are also connected to an even-numbered main bit line (e.g., $MB_2$) which is provided therebetween. The gates of the bank selecting MOSFETs $BSE_1$, $BSE_2$, ..., etc. which are connected to these even-numbered sub-bit lines are alternately connected to two bank select lines $BE_1$ and $BE_2$.

Figure 3:
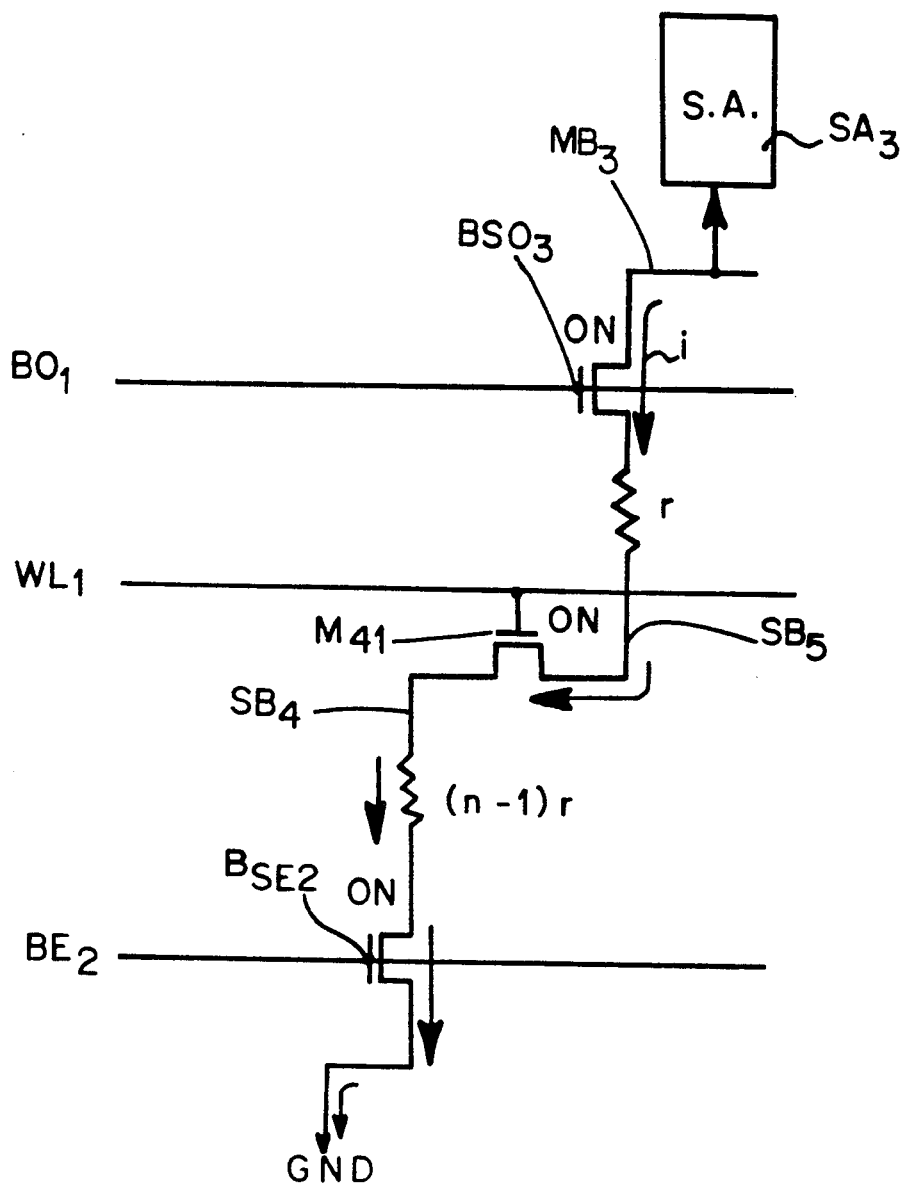
FIG. 3 is a circuit diagram schematically showing the current flow when information is read out from a memory cell in the embodiment.
Figure 4:
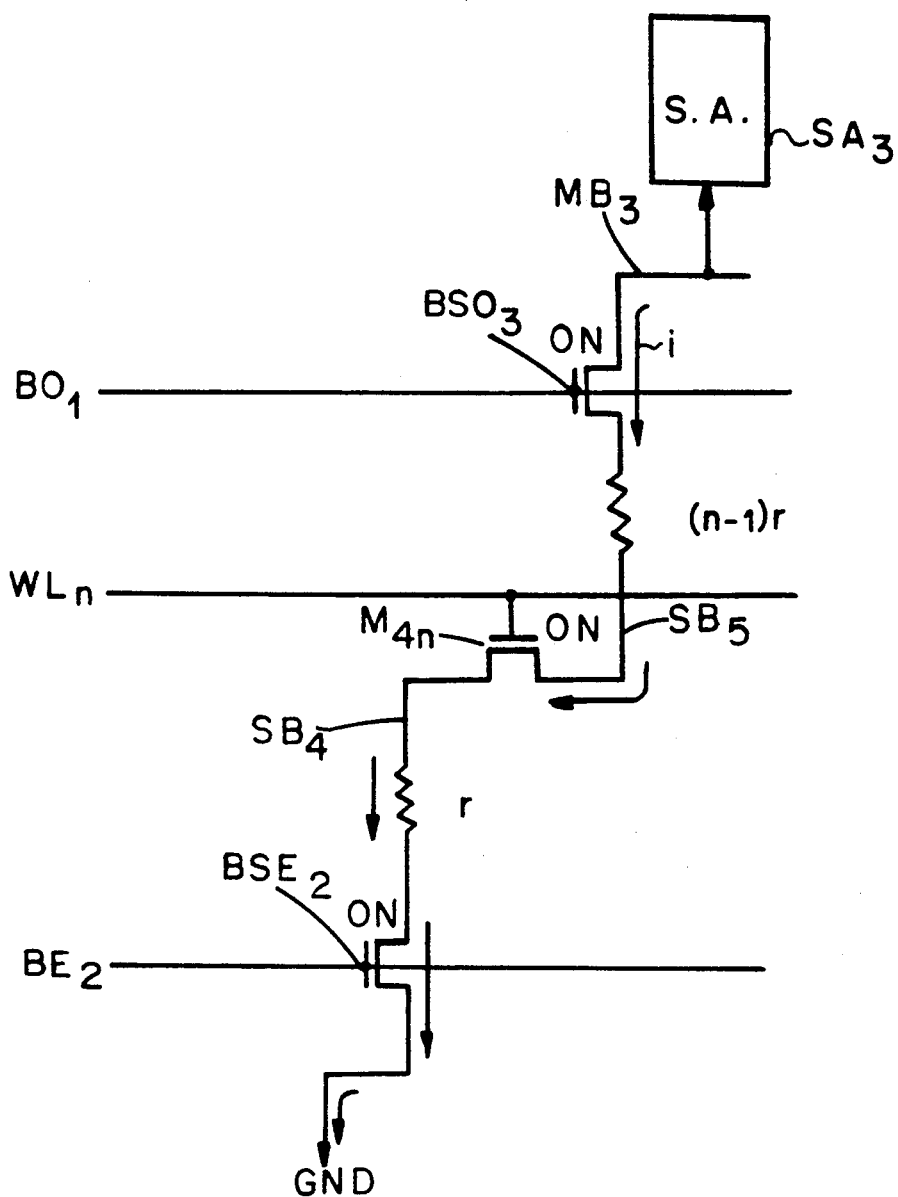
FIG. 4 is a circuit diagram schematically showing the current flow when information is read out from another memory cell which is positioned differently in the embodiment.
Figure 5:
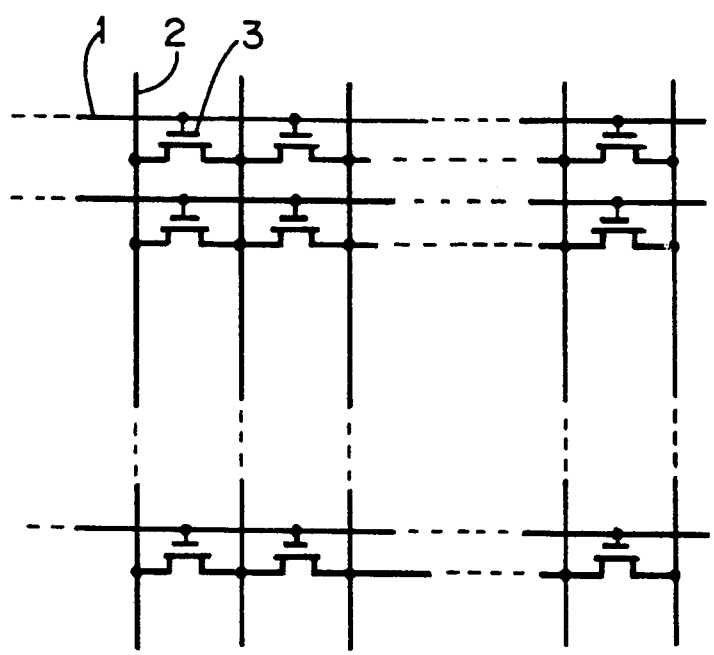
FIG. 5 is a circuit diagram showing a prior art ROM.
Figure 6:
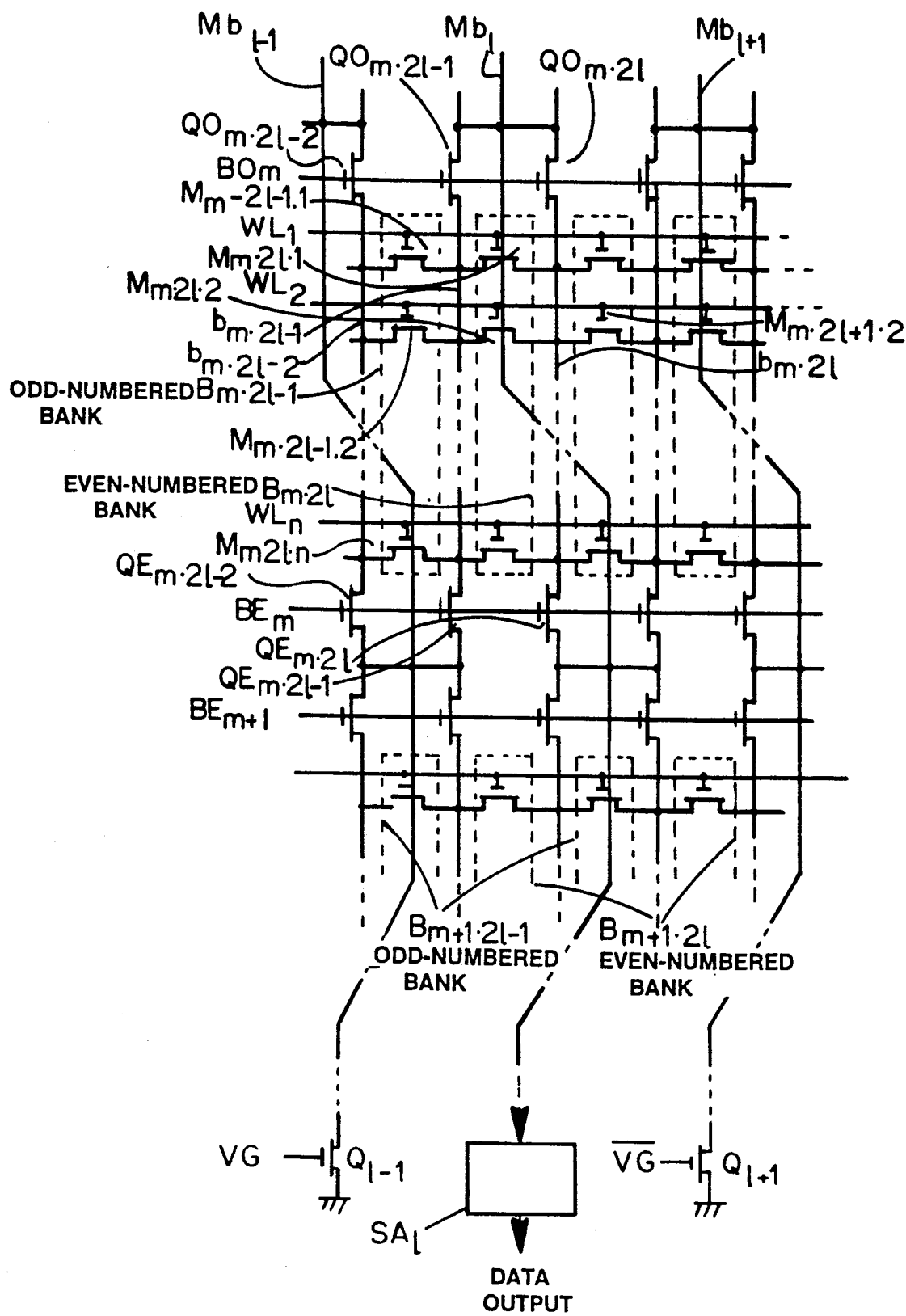
FIG. 6 is a circuit diagram showing a prior art ROM with a hierarchical bit line system.
Figure 7:
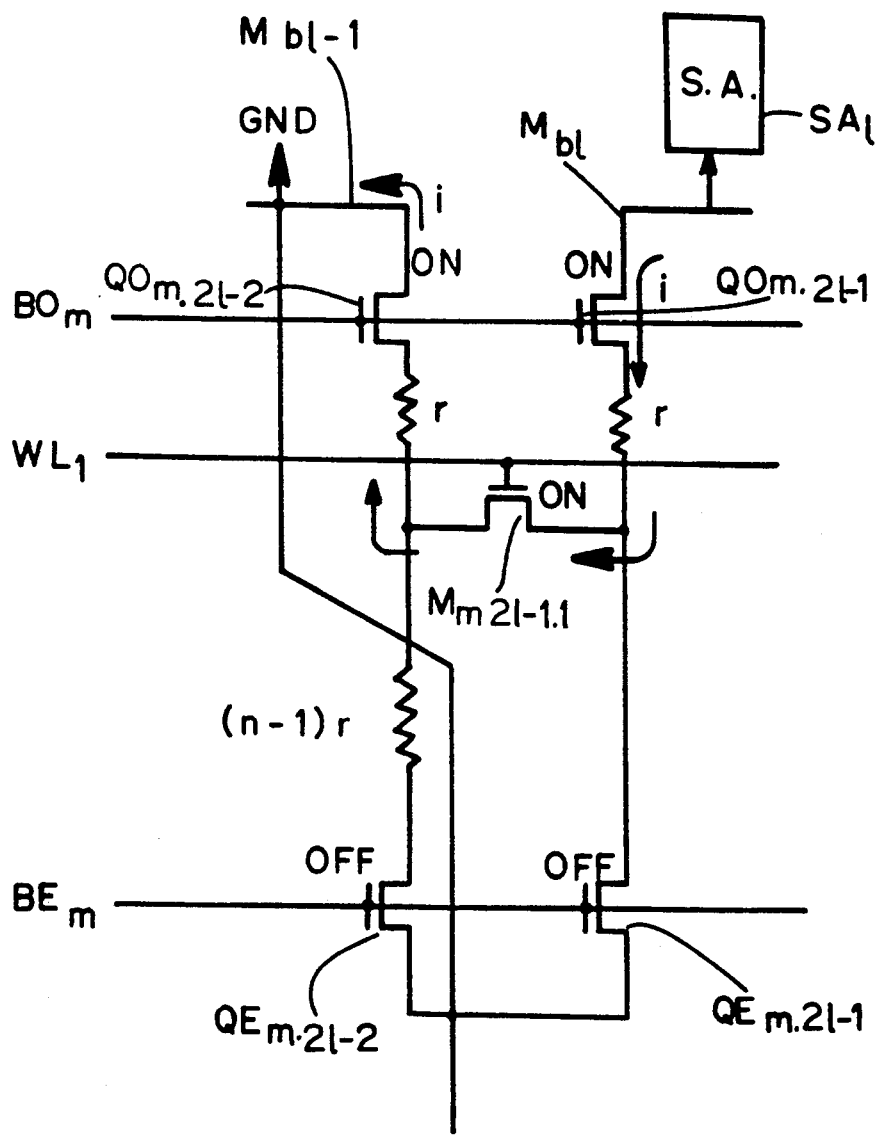
FIG. 7 is a circuit diagram schematically showing the current flow when information is read out from a memory cell in the prior art ROM shown in FIG. 6.
Figure 8:
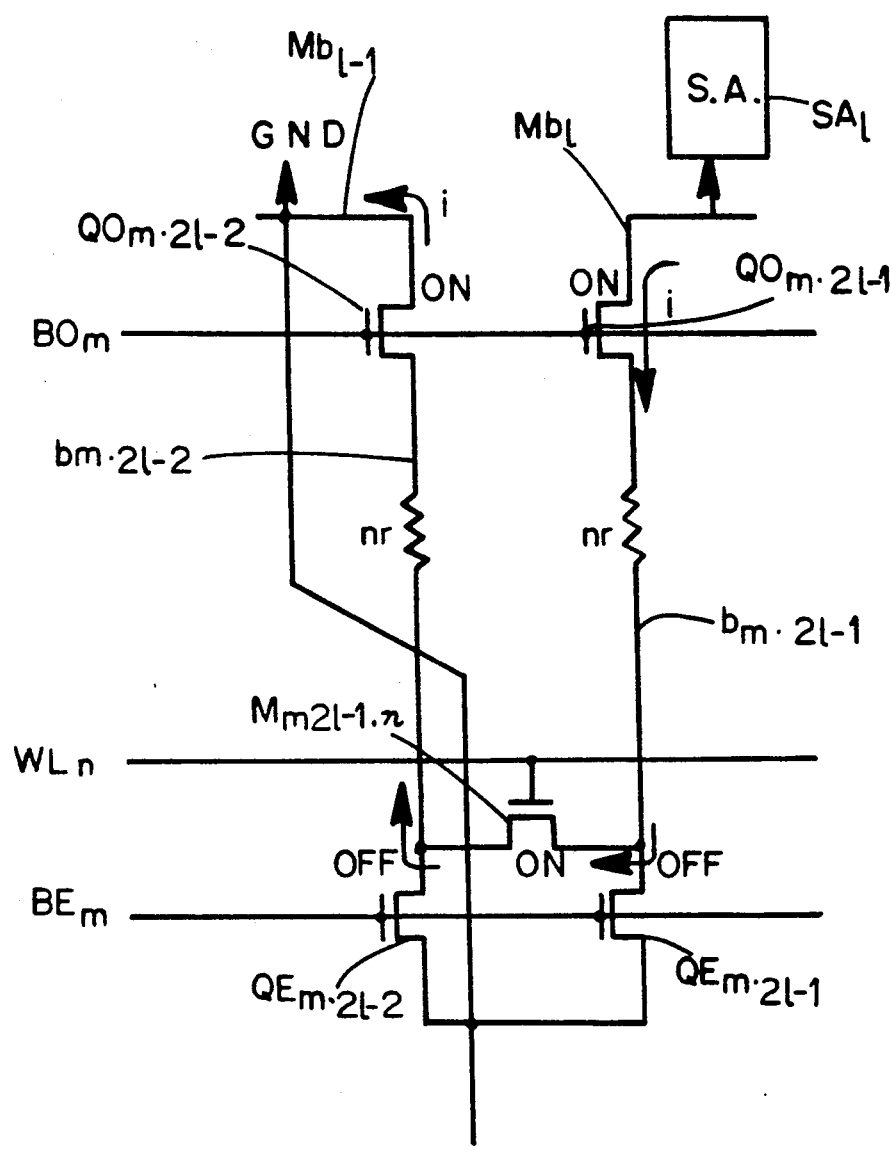
FIG. 8 is a circuit diagram schematically showing the current flow when information is read out from another memory cell which is positioned differently in the prior art ROM shown in FIG. 6.

In the ROM of the above-mentioned configuration, the case where information is read out from a memory cell $M_{41}$ is considered. In this case, the bank select lines $BO_1$ and $BE_2$ are set to High, the other bank select lines $BO_2$ and $BE_1$ are set to Low, and the word line $WL_1$ is set to High. The control signal VG for the transistor $Q_2$ connected to the main bit line $MB_2$ is set to High, so that the main bit line $MB_2$ is grounded. The circuit in this state is shown in FIG. 3. The discharge current i flows through the main bit line $MB_3$, the bank selecting MOSFET $BSO_3$, the sub-bit line $SB_5$, the memory cell $M_{41}$, the sub-bit line $SB_4$, and the main bit line $MB_2$, in this order. The total value of diffusion resistance on the sub-bit lines $SB_5$ and $SB_4$ in the path is $r+(n-1)r=nr$, if the value of resistance between respective two cells is indicated by r. Now, the case where information is read out from the memory cell $M_{4n}$ is considered. The circuit in this case is shown in FIG. 4. The total value of diffusion resistance on the sub-bit lines $SB_5$ and $SB_4$ in the path is $(n-1)r+r=nr$.

As described above, irrespective of the position of the memory cell from which information is to be read out, the diffusion resistance on sub-bit lines is always constant, so that the value of the discharge current is constant even when the position of the memory cell differs. Moreover, since the value of the diffusion resistance is half as compared with the maximum value of the diffusion resistance in the prior art, the value of the discharge current is larger.

In the above embodiment, though a mask ROM has been described as an example, the invention is applicable to any type of semiconductor read only memory such as an EPROM or an E²PROM in which a plurality of memory cells are disposed in a matrix array.

As described above, according to the invention, irrespective of the position of the memory cell from which information is to be read out, the resistance against the read-out current is constant. Therefore, especially when diffusion bit lines are used, in the prior art, since the resistance varies from position to position of memory cells from which information is to be read out, the value of read-out current must be set on the basis of the minimum resistance. On the contrary, according to the invention, a larger read-out current can be used. As a result, the read operation is performed at a higher speed, and a wide operation margin can be ensured, thereby guaranteeing a stable read operation.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor read only memory comprising:
   a plurality of first bit lines;
   a plurality of groups of memory cells, in each group, memory cells being electrically connected in parallel between two adjacent ones of said first bit lines;
   second bit lines, the proportion of said second bit lines to said first bit lines being 1 to 2;
   a group of first bank selecting switches each of which is connected between one end of an odd-numbered one of said first bit lines and one end of an odd-numbered one of said second bit liens; and
   a group of second bank selecting switches each of which is connected between one end of an even-numbered one of said first bit lines and one end of an even-numbered one of said second bit lines.

2. A semiconductor read only memory according to claim 1, wherein said groups of first and second bank selecting switches are constructed using a plurality of pairs of two adjacent selecting switches, said adjacent two selecting switches being connected to the same one of said second bit lines.

3. A semiconductor read only memory according to claim 1, wherein said memory cells and said selecting switches are MOSFETs.

4. A semiconductor read only memory according to claim 1, wherein said first bit liens are made by diffusion layers, and said second bit lines are metal lines.

* * * * *

UNITED STATES PATENT AND TRADEMARK OFFICE
CERTIFICATE OF CORRECTION

PATENT NO. : 5,268,861
DATED : December 7, 1993
INVENTOR(S) : Yasuhiro HOTTA

It is certified that error appears in the above-indentified patent and that said Letters Patent is hereby corrected as shown below:

Column 4, line 52, change "liens" to --lines--.

Signed and Sealed this

Seventh Day of June, 1994

*Attest:*

BRUCE LEHMAN

*Attesting Officer*  *Commissioner of Patents and Trademarks*